United States Patent
Kelley et al.

(10) Patent No.: US 7,352,038 B2
(45) Date of Patent: Apr. 1, 2008

(54) ORGANIC THIN FILM TRANSISTOR WITH POLYMERIC INTERFACE

(75) Inventors: Tommie W. Kelley, Coon Rapids, MN (US); Larry D. Boardman, Woodbury, MN (US); Timothy D. Dunbar, Woodbury, MN (US); Todd D. Jones, St. Paul, MN (US); Dawn V. Muyres, St. Paul, MN (US); Mark J. Pellerite, Woodbury, MN (US); Terrance P. Smith, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 53 days.

(21) Appl. No.: 11/227,547

(22) Filed: Sep. 15, 2005

(65) Prior Publication Data
US 2006/0011909 A1   Jan. 19, 2006

Related U.S. Application Data

(62) Division of application No. 10/012,654, filed on Nov. 5, 2001, now Pat. No. 6,946,676.

(51) Int. Cl.
*H01L 29/94* (2006.01)
(52) U.S. Cl. .......................... 257/410; 257/40; 257/59; 257/72; 257/E51.006; 257/E51.007; 257/E51.032
(58) Field of Classification Search ................ 257/40, 257/59, 72, 410, 411, 347, E51.006, E51.007, 257/E51.028
See application file for complete search history.

(56) References Cited

U.S. PATENT DOCUMENTS

| | | | |
|---|---|---|---|
| 4,539,061 | A | 9/1985 | Sagiv |
| 4,561,726 | A | 12/1985 | Goodby et al. |
| 5,079,179 | A | 1/1992 | Josefowicz et al. |
| 5,207,862 | A | 5/1993 | Baker et al. |
| 5,347,144 | A | 9/1994 | Garnier et al. |
| 5,500,537 | A | 3/1996 | Tsumura et al. |
| 5,543,200 | A | 8/1996 | Hargis et al. |
| 5,546,889 | A | 8/1996 | Wakita et al. |

(Continued)

FOREIGN PATENT DOCUMENTS

DE      EP0786820 A2 *   7/1997

(Continued)

OTHER PUBLICATIONS

Bao, "Materials and Fabrication Needs for Low-Cost Organic Transistor Circuits", *Advanced Materials*, (2000).

(Continued)

*Primary Examiner*—Minhloan Tran
*Assistant Examiner*—Benjamin Tzu-Hung Liu
(74) *Attorney, Agent, or Firm*—Kent S. Kokko

(57) ABSTRACT

Provided is an organic thin film transistor comprising a polymeric layer interposed between a gate dielectric and an organic semiconductor layer. Various homopolymers, copolymers, and functional copolymers are taught for use in the polymeric layer. An integrated circuit comprising a multiplicity of thin film transistors and methods of making a thin film transistor are also provided. The organic thin film transistors of the invention typically exhibit improvement in one or more transistor properties.

17 Claims, 1 Drawing Sheet

U.S. PATENT DOCUMENTS

| | | | |
|---|---|---|---|
| 5,625,199 | A | 4/1997 | Baumbach et al. |
| 5,965,679 | A | 10/1999 | Godschalx et al. |
| 6,091,196 | A | 7/2000 | Codama |
| 6,114,088 | A * | 9/2000 | Wolk et al. ............... 430/273.1 |
| 6,150,668 | A * | 11/2000 | Bao et al. ...................... 257/40 |
| 6,190,777 | B1 | 2/2001 | Asano et al. |
| 6,207,472 | B1 | 3/2001 | Callegari et al. |
| 6,252,245 | B1 * | 6/2001 | Katz et al. ..................... 257/40 |
| 6,265,243 | B1 | 7/2001 | Katz et al. |
| 6,288,188 | B1 | 9/2001 | Godschalx et al. |
| 6,313,185 | B1 | 11/2001 | Lau et al. |
| 6,326,640 | B1 | 12/2001 | Shi et al. |
| 6,335,539 | B1 * | 1/2002 | Dimitrakopoulos et al. .. 257/40 |
| 6,413,790 | B1 | 7/2002 | Duthaler et al. |
| 6,433,359 | B1 | 8/2002 | Kelley et al. |
| 6,617,609 | B2 | 9/2003 | Kelley et al. |
| 6,638,680 | B2 | 10/2003 | Lamotte et al. |
| 6,768,132 | B2 | 7/2004 | Smith et al. |
| 6,864,396 | B2 | 3/2005 | Smith et al. |
| 6,870,180 | B2 | 3/2005 | Dodabalapur et al. |
| 6,946,676 | B2 | 9/2005 | Kelley et al. |
| 2002/0022191 | A1 | 2/2002 | Lamotte et al. |
| 2002/0063677 | A1 | 5/2002 | Drzaic |
| 2002/0155729 | A1 | 10/2002 | Baldwin et al. |
| 2003/0054586 | A1 | 3/2003 | Shtein et al. |
| 2003/0097010 | A1 | 5/2003 | Vogel et al. |

FOREIGN PATENT DOCUMENTS

| | | |
|---|---|---|
| DE | 198 15 220 A1 | 9/1999 |
| EP | 0 716 459 A2 | 6/1996 |
| EP | 0 786 820 A2 | 7/1997 |
| EP | 0 716 459 A3 | 11/1997 |
| EP | 0 786 820 A3 | 7/1998 |
| EP | 1 041 652 A2 | 10/2000 |
| WO | WO 97/18944 A1 | 5/1997 |
| WO | WO 01/01502 A2 | 1/2001 |
| WO | WO 01/47043 A1 | 6/2001 |
| WO | WO 02/05361 A1 | 1/2002 |
| WO | WO 02/41186 A1 | 5/2002 |
| WO | WO 03/028125 A2 | 4/2003 |
| WO | WO 03/041185 A2 | 5/2003 |
| WO | WO 03/041186 A2 | 5/2003 |
| WO | WO 03/077327 A1 | 9/2003 |

OTHER PUBLICATIONS

Collet et al., "Performances of Sexithiophene Based Thin-Film Transistor Using Self-Assembled Monolayers", Materials Research Society Symposium Proceedings, (1998), pp. 407-412, vol. 488, Materials Research Society.

Crone et al., "Large-scale Complementary Integrated Circuits Based on Organic Transistors", *Nature*, (Feb. 2000), pp. 521-523 vol. 403.

Dimitrakopoulos et al., "Organic Thin Film Transistors for Large Area Electronics", *Advanced Materials*, (Jan. 16, 2002), pp. 99-117, vol. 14, No. 2, Wiley-VCH Verlag GmbH, D-69469 Weinheim.

Drury et al., "Low-Cost All-Polymer Integrated Circuits", *Applied Physics Letters*, (Jul. 6, 1998), pp. 108-110 vol. 73, No. 1, American Institute of Physics.

*Encyclopedia of Chemcial Technology*, "Electrically Conductive Polymers", (1994), pp. 61-88, vol. 9, 4th Edition, John Wiley & Sons, Inc., New York, NY.

*Encyclopedia of Polymer Science and Engineering*, "Living Polymer Systems", (1989), pp. 420-445, Supplement vol., John Wiley & Sons, Inc., New York, NY.

*Encyclopedia of Polymer Science and Engineering*, "Ring-Opening Polymerization", (1988), pp. 622-647, vol. 14, John Wiley & Sons, Inc., New York, NY.

*Encyclopedia of Polymer Science and Engineering*, "Styrene Polymers", (1989), pp. 21-45, 72-81, vol. 16, John Wiley & Sons, Inc., New York, NY.

*Encyclopedia of Polymer Science and Engineering*, "Xylylene Polymers", (1989), pp. 990-1025, vol. 17, John Wiley & Sons, Inc., New York, NY.

Gundlach et al., "High Mobility, Low Voltage Organic Thin Film Transistors", *1999 International Electron Devices Meeting Technical Digest*, (Dec. 1999), pp. 111-114.

Gundlach et al., "Improved Organic Thin Film Transistor Performance Using Chemically-Modified Gate Dielectrics", *Proceedings of SPIE*, (2001), pp. 54-64 vol. 4466.

Gundlach et al., "Pentacene Organic Thin-Film Transistors—Molecular Ordering and Mobility", *IEEE Electron Device Letters*(Mar. 1997), pp. 87-89 vol. 18, No. 3.

Jackson et al., "Organic Thin-Film Transistors for Organic Light-Emitting Flat-Panel Display Backplanes", *IEEE Journal of Selected Topics in Quantum Electronics*, (Jan./Feb. 1998), pp. 100-104, vol. 4, No. 1.

Kagan et al., "Patterning Organic-Inorganic Thin-Film Transistors Using Microcontact Printed Templates", *Applied Physics Letters*, (Nov. 19, 2001), pp. 3536-3538 vol. 79, No. 21.

Kane et al., "Analog and Digital Circuits Using Organic Thin-Film Transistors on Polyester Substrates", *IEEE Electron Device Letters*, (Nov. 2000), pp. 534-536 vol. 21, No. 11.

Katz et al., "Organic Field-Effect Transistors With Polarizable Gate Insulators", Journal of Applied Physics, (Feb. 1, 2002), pp. 1572-1576, vol. 91, No. 3.

Klauk et al., "A Reduced Complexity Process for Organic Thin-Film Transistors", *Applied Physics Letters*, (Mar. 27, 2000), pp. 1692-1694 vol. 76, No. 13.

Klauk et al., "Pentacene Organic Thin-Film Transistors and ICs", *Solid State Technology*, (Mar. 2000), pp. 63-64, 66-67, 72, 75 and 77.

Klauk et al., "Pentacene Organic Thin-Film Transistors for Circuit and Display Applications", *IEEE Transactions on Electron Devices*, (Jun. 1999), pp. 1258-1263 vol. 46, No. 6.

Lin et al., "Pentacene-Based Organic Thin Film Transistors", *IEEE Transactions on Electron Devices*, (Aug. 1997), pp. 1325-1331 vol. 44, No. 8.

Lin et al., "Stacked Pentacene Layer Organic Thin-Film Transistors with Improved Characteristics", *IEEE Electron Device Letters*, (Dec. 1997), pp. 606-608 vol. 18, No. 12.

Marshall, "Welcome to Plastic Valley", Business 2.0, (Jan. 2001), 3 pages.

Martin et al., "Development of a Low-Dielectric-Constant Polymer for the Fabrication of Integrated Circuit Interconnect", *Advanced Materials* (Dec. 1, 2000), pp. 1769-1778, vol. 12, No. 23, Wiley-VCH Verlag GmbH, D-69469 Weinheim.

Meyer Zu Heringdorf et al., "Growth Dynamics of Pentacene Thin Films",*Nature*, (Aug. 2001), pp. 517-520 vol. 412.

Pelaprat et al., Synthèse D'Alkylphosphonates Á Longues Chaines Hydrocarbonées, Modifications Chimiques Et Applications-II. Addition de HP(O)(OEt)$_2$ Sur Les Alcènes ET Phosphonation Directe D'Halogénures D'Alkyles, *European Polymer Journal*, (1996), pp. 761-766, vol. 32, No. 6, Pergamon Press, Ltd., Oxford, GB (English Abstract).

Rogers et al., "Organic Smart Pixels and Complementary Inverter Circuits Formed on Plastic Substrates by Casting and Rubber Stamping", *IEEE Electron Devices Letters*, (Mar. 2000), pp. 100-103 vol. 21, No. 3.

Shaw et al., "Organic Electronics: Introduction", IBM J. Res. & Dev., (Jan. 2001), pp. 3-9, vol. 45, No. 1, International Business Machines Corporation.

Sheraw et al., "Spin-On Polymer Gate Dielectric for High Performance Organic Thin Film Transistors", Materials Research Society Symposium Proceedings, (2000), pp. 403-408, vol. 558, Materials Research Society, Pittsburg, PA.

Song, "Effects of Hydrophobic Treatment on the Performance of Pentacene TFT", *KIEE International Transactions on Electrophysics and Applications*, (Apr. 2002), pp. 136-138, vol. 12C, No. 2, Korean Inst. Electr. Eng., South Korea.

Swiggers et al., "Orientation of Pentacene Films Using Surface Alignment Layers and its Influence on Thin-Film Transistor Characteristics", *Applied Physics Letters*, (August 27, 2001), pp. 1300-1302 vol. 79, No 9.

Tate et al., "Anodization and Microcontact Printing on Electroless Silver: Solution-Based Fabrication Procedures for Low-Voltage Electronic Systems with Organic Active Components", *Langmuir*, (2000), pp. 6054-6060 vol. 16, American Chemical Society.

\* cited by examiner

ORGANIC THIN FILM TRANSISTOR WITH POLYMERIC INTERFACE

CROSS-REFERENCE TO RELATED APPLICATION

This is a divisional of application Ser. No. 10/012,654, filed Nov. 5, 2001, now U.S. Pat. No. 6,946,676.

TECHNICAL FIELD

This invention relates to organic thin film transistors having improved performance. More particularly, the invention relates to organic thin film transistors having a polymeric layer between the semiconductor and gate dielectric and methods of making such transistors.

BACKGROUND

Organic semiconductors are of great interest for a variety of applications involving low-cost electronics. It is believed that organics can be synthesized to incorporate the necessary electronic properties for a wide variety of devices, and also can be constructed to allow low-cost, reel-to-reel processing that is not currently possible for crystalline silicon microelectronics.

One area of concern in organic electronic devices is the quality of the interface formed between the organic semiconductor and another device layer. Prior work on the interface between the semiconductor and the gate dielectric has included using a silazane or silane coupling agents on silicon oxide surfaces. Silane coupling agents also require complex deposition processes.

EP 1041652 A2 describes the use of several surface treatments to enhance the crystalline domain size of solution-cast oligothiophenes on $SiO_X$ for thin film transistors (TFTs), although measured charge carrier mobility values were generally lower than the untreated controls. Other work involving surface treatments in TFTs involved poly(vinyl alcohol) layers, which may be relatively thick. In rare instances, previous work has shown minor improvements in mobility. The predominant effects shown in the previous work have been no improvement and/or detrimental effects on mobility, without regard for other important aspects of device performance.

SUMMARY

The present inventors discovered materials for and methods of improving the properties of organic thin film transistors by controlling the interface between the organic semiconductor and the dielectric material. The organic thin film transistors of the invention also are suitable for low-cost manufacturing processes.

Briefly, the present invention provides an organic thin film transistor (OTFT) comprising a substantially nonfluorinated polymeric layer interposed between a gate dielectric and an organic semiconductor layer, the substantially nonfluorinated polymeric layer having a thickness less than about 400 Å.

In another aspect, the present invention provides a method of making an OTFT comprising providing a substrate, forming a gate electrode on the substrate, forming a gate dielectric on the gate electrode, applying a substantially nonfluorinated polymeric layer (having a thickness less than about 400 Å) interposed between the gate dielectric and an organic semiconductor layer, depositing an organic semiconductor layer adjacent to the polymeric layer, and depositing a source electrode and a drain electrode contiguous to the organic semiconductor layer. The polymeric layer comprises a polymer selected from one of those described above in reference to the OTFTs of the invention, or a combination of two or more of said polymers. An integrated circuit comprising a plurality of OTFTs is also provided.

Any known thin film transistor configuration is possible with the invention. For example, the source and drain electrodes may be adjacent to the gate dielectric with the organic semiconductor layer over the source and drain electrodes, or the organic semiconductor layer may be interposed between the source and drain electrodes and the gate dielectric. In each option, the invention provides a polymeric layer between the organic semiconductor layer and the gate dielectric.

The present invention provides organic thin film transistors with one or more improvements over known devices. With the present invention, improvements in properties such as threshold voltage, subthreshold slope, on/off ratio, and charge-carrier mobility can be achieved. In addition, large improvements in at least one property, such as charge-carrier mobility, can be achieved with the invention, while maintaining other OTFT properties within desirable ranges. The improvements in device performance provided by the present invention enable the production by simpler processing conditions of complex circuits having higher operating speeds than an OTFT made without the polymer layer. This invention also enables the production of larger circuit elements having comparable performance to devices with very small features. Devices with larger feature sizes can be less expensive as they do not require expensive precision patterning methods.

As used herein, "a" or "an" or "the" are used interchangeably with "at least one", to mean "one or more" of the element being modified.

Other features and advantages of the invention will be apparent from the following detailed description of the invention and the claims. The above summary of principles of the disclosure is not intended to describe each illustrated embodiment or every implementation of the present disclosure. The detailed description that follows more particularly exemplifies certain preferred embodiments utilizing the principles disclosed herein.

DETAILED DESCRIPTION

Figure 1:
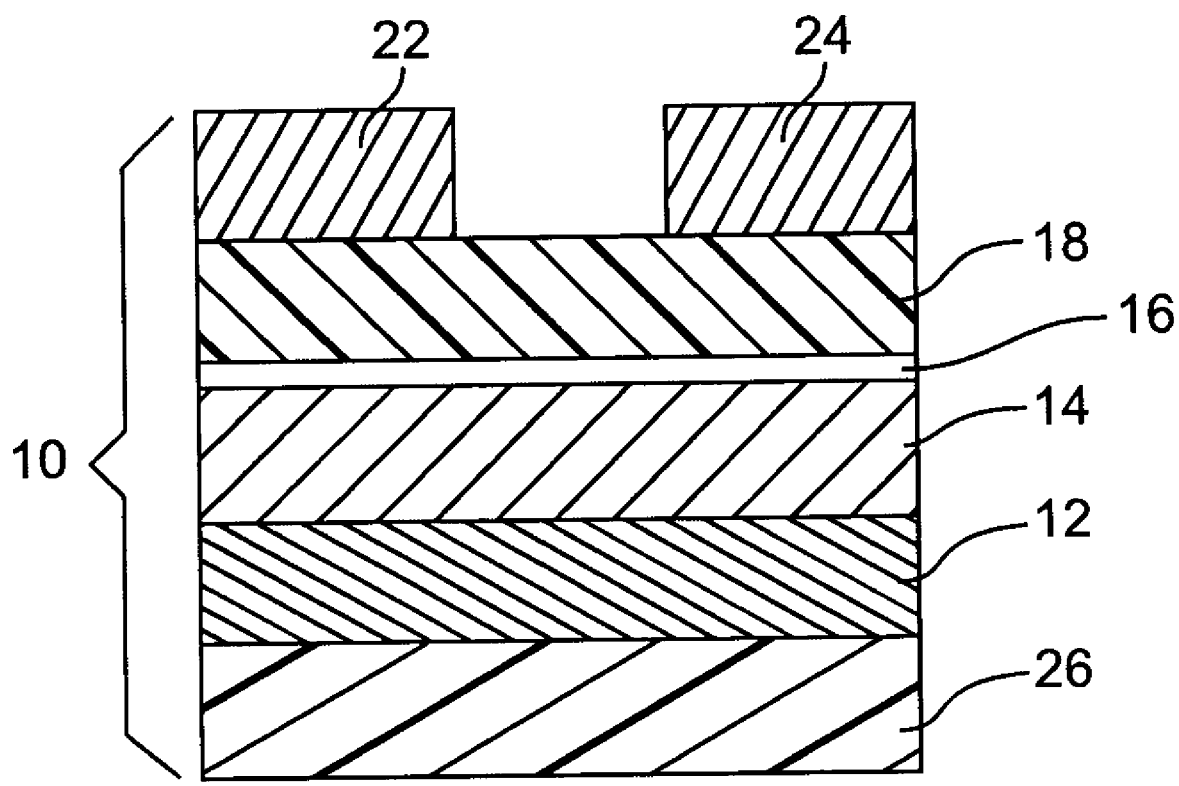
FIG. 1 is a cross-section of a thin film transistor of the invention.

Generally, a thin film transistor includes a gate electrode, a gate dielectric on the gate electrode, a source electrode and a drain electrode adjacent to the gate dielectric, and a semiconductor layer adjacent to the gate dielectric and adjacent to the source and drain electrodes. More specifically, an organic thin film transistor (OTFT) has an organic semiconductor layer. Such OTFTs are known in the art as shown, for example, in copending application U.S. Pat. No. 6,433,359 which is herein incorporated by reference.

The organic thin film transistor of the present invention further includes a polymeric layer interposed between the gate dielectric and the organic semiconductor layer.

Referring now to FIG. 1, a cross section of one embodiment of the organic thin film transistor 10 is shown in cross-section. Gate electrode 12 is provided on substrate 26.

Gate dielectric 14 is provided on gate electrode 12. The substantially nonfluorinated polymer layer 16 is interposed between gate dielectric 14 and organic semiconductor layer 18. Source electrode 22 and drain electrode 24 are provided adjacent to organic semiconductor layer 18. The transistor embodiment describe above and depicted in FIG. 1 includes a source and drain electrodes on the semiconductor layer. Other embodiments are within the scope of the present invention.

Substrate

A substrate can be used to support the OTFT, e.g., during manufacturing, testing, storage, use, or any combination thereof. The gate electrode and/or gate dielectric may provide sufficient support for the intended use of the resultant OTFT such that another substrate is not required. For example, doped silicon can function as the gate electrode and support the OTFT. In another example, one substrate may be selected for testing or screening various embodiments while another substrate is selected for commercial embodiments. In another embodiment, a support may be detachably adhered or mechanically affixed to a substrate, such as when the support is desired for a temporary purpose. For example, a flexible polymeric substrate may be adhered to a rigid glass support, which support could be removed. In some embodiments, the substrate does not provide any necessary electrical function for the OTFT. This type of substrate is termed a "non-participating substrate" in this document.

Useful substrate materials can include organic and/or inorganic materials. For example, the substrate may comprise inorganic glasses, ceramic foils, polymeric materials, filled polymeric materials, coated metallic foils, acrylics, epoxies, polyamides, polycarbonates, polyimides, polyketones, poly(oxy-1,4-phenyleneoxy-1,4-phenylenecarbonyl-1,4-phenylene) (sometimes referred to as poly(ether ether ketone) or PEEK), polynorbornenes, polyphenyleneoxides, poly(ethylene naphthalenedicarboxylate) (PEN), poly(ethylene terephthalate) (PET), poly(phenylene sulfide) (PPS), and fiber-reinforced plastics (FRP).

A flexible substrate is used in some embodiments of the present invention. This allows for roll processing, which may be continuous, providing economy of scale and economy of manufacturing over some flat and/or rigid substrates. The flexible substrate chosen preferably is capable of wrapping around the circumference of a cylinder of less than about 50 cm diameter without distorting or breaking. The substrate chosen more preferably is capable of wrapping around the circumference of a cylinder of less than about 25 cm diameter without distorting or breaking the substrate. In some embodiments, the substrate chosen most preferably is capable of wrapping around the circumference of a cylinder of less than about 10 cm diameter, or even about 5 cm diameter, without distorting or breaking the substrate. The force used to wrap the flexible substrate of the invention around a particular cylinder typically is low, such as by unassisted hand, i.e., without the aid of levers, machines, hydraulics, and the like. The preferred flexible substrate may be rolled upon itself.

Gate Electrode

The gate electrode can be any useful conductive material. For example, the gate electrode may comprise doped silicon, or a metal, such as aluminum, chromium, copper, gold, silver, nickel, palladium, platinum, tantalum, and titanium. Conductive polymers also can be used, for example polyaniline, poly(3,4-ethylenedioxythiophene)/poly(styrene sulfonate) (PEDOT:PSS). In addition, alloys, combinations, and multilayers of these materials may be useful.

Gate Dielectric

The gate dielectric is provided on the gate electrode, for example, through a deposition process. This gate dielectric electrically insulates the gate electrode under the operating conditions of the OTFT device from the balance of the device. Thus, the gate dielectric comprises an electrically insulating material. The gate dielectric should have a dielectric constant above about 2, more preferably above about 5. The dielectric constant of the gate dielectric also can be very high, for example, 80 to 100 or even higher. Useful materials for the gate dielectric may comprise, for example, an organic or inorganic electrically insulating material, or combinations thereof.

The gate dielectric may comprise a polymeric material, such as polyvinylidenefluoride (PVDF), cyanocelluloses, polyimides, epoxies, etc. In some embodiments, an inorganic capping layer comprises the outer layer of an otherwise polymeric gate dielectric for improved bonding to the polymeric layer and/or improved dielectric properties.

Specific examples of inorganic materials useful for the gate dielectric include strontiates, tantalates, titanates, zirconates, aluminum oxides, silicon oxides, tantalum oxides, titanium oxides, silicon nitrides, barium titanate, barium strontium titanate, barium zirconate titanate, zinc selenide, and zinc sulfide. In addition, alloys, combinations, and multilayers of these can be used for the gate dielectric. Of these materials, aluminum oxides, silicon oxides, silicon nitrides, and zinc selenide are preferred.

The gate dielectric can be deposited in the OTFT as a separate layer, or formed on the gate such as by oxidizing, including anodizing, the gate material to form the gate dielectric.

Source and Drain Electrodes

The source electrode and drain electrode are separated from the gate electrode by the gate dielectric, while the organic semiconductor layer can be over or under the source electrode and drain electrode. The source and drain electrodes can be any useful conductive material. Useful materials include those described above for the gate electrode, for example, aluminum, barium, calcium, chromium, copper, gold, silver, nickel, palladium, platinum, titanium, polyaniline, PEDOT:PSS, other conducting polymers, alloys thereof, combinations thereof, and multilayers thereof.

The thin film electrodes (e.g., gate electrode, source electrode, and drain electrode) can be provided by any useful means such as physical vapor deposition (e.g., thermal evaporation, sputtering), plating, or ink jet printing. The patterning of these electrodes can be accomplished by known methods such as shadow masking, additive photolithography, subtractive photolithography, printing, micro-contact printing, transfer printing, and pattern coating.

Organic Semiconductors

Useful materials for the organic semiconductor layer include acenes, such as anthracene, tetracene, pentacene, and substituted pentacenes. Substituted pentacene compounds that are useful as organic semiconductors in the present invention comprise at least one substituent selected from the group consisting of electron-donating substituents (for example, alkyl, alkoxy, or thioalkoxy), halogen substituents, and combinations thereof. Useful substituted pentacenes include but are not limited to 2,9-dialkylpentacenes and 2,10-dialkylpentacenes, wherein the alkyl group has from 1 to 12 carbons; 2,10-dialkoxypentacenes, and 1,4,8, 11-tetraalkoxypentacenes. Such substituted pentacenes are taught in U.S. Published Appln. No. 2003/0100779, and U.S. Pat. No. 6,864,396, which are herein incorporated by reference.

Examples of other useful organic semiconductors include perylenes, fullerenes, phthalocyanines, oligothiophenes, and substituted derivatives thereof. Particular organic semiconductor compounds include sexithiophene, $\alpha,\omega$-dihexylsexithiophene, quinquethiophene, quaterthiophene, $\alpha,\omega$-dihexylquaterthiophene, $\alpha,\omega$-dihexylquinquethiophene, poly (3-hexylthiophene), bis(dithienothiophene), anthradithiophene, dihexylanthradithiophene, polyacetylene, polythienylenevinylene, $C_{60}$, copper(II) hexadecafluorophthalocyanine, and N,N'-bis(pentadecafluoroheptylmethyl)naphthalene-1,4,5,8-tetracarboxylic diimide.

The organic semiconductor layer can be provided by any useful means, such as for example, vapor deposition, solution deposition, spin coating, and printing techniques.

Polymeric Layer

The polymeric layer of the invention has a maximum thickness less than about 400 Angstroms (Å), more preferably less than about 200 Å, and most preferably less than about 100 Å. The polymeric layer of the invention generally has a thickness of at least about 5 Å, more preferably at least about 10 Å. The thickness can be determined through known methods, e.g., ellipsometry.

The polymeric layer is selected from many options. For example, a substantially nonfluorinated polymeric layer having a thickness within the range set forth above may be used. In this document, "substantially nonfluorinated" means that less than about 5% (more preferably less than about 1% and even more preferably 0%) of the carbons in the polymeric layer have fluorine substituents.

As used in this document, "substituted" means substituted by substituents that do not interfere with the desired performance of the OTFT. Examples of suitable substituents include halogen (e.g., Cl, Br, I), cyano, $C_1$-$C_{20}$ aliphatic, aryl, and arylalkyl groups, and the like. As used in this document, "heteroatom" means a non-carbon atom such as O, P, S, N and Si.

The polymeric layer may comprise a polymer having interpolymerized units according to the formula:

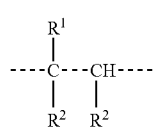

(I)

in an amount from about 50 to 100% of interpolymerized units according to Formula I, and from 0 to about 50% of said interpolymerized units according to the formula:

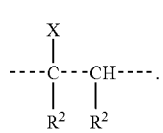

(II)

In these formulas, each $R^1$ and $R^2$ comprises, independently, a group selected from hydrogen; $C_1$-$C_{20}$ aliphatic; chloro; bromo; carboxy; acyloxy; nitrile; amido; alkoxy; carboalkoxy; aryloxy; chlorinated aliphatic; brominated aliphatic; $C_6$-$C_{20}$ aryl; $C_7$-$C_{20}$ arylalkyl; hydroxy when $R_1$ and X are different; and combinations thereof which may contain one or more heteroatom(s) and/or one or more functional group(s). Each X, independently, comprises a functional group capable of bonding to the gate dielectric. In addition, any combination of at least two $R^1$, $R^2$, and/or X groups may together form a cyclic or polycyclic, aliphatic or aromatic group.

Particular selections for $R^1$ and/or $R^2$ include groups selected from hydrogen, $C_1$-$C_{20}$ aliphatics, which may be linear or branched, saturated or unsaturated; $C_6$-$C_{20}$ aryl; and $C_7$-$C_{20}$ arylalkyl which also may contain linear or branched, and saturated or unsaturated segments. Specific polymers may be derived from precursor monomers such as methyl (meth)acrylate, straight-chain or branched $C_2$-$C_{18}$ aliphatic or arylalkyl (meth)acrylates, (meth)acrylic acid, (meth)acrylonitrile, 2-hydroxyethyl (meth)acrylate, vinyl chloride, vinyl acetate, ethylene, straight-chain or branched $C_3$-$C_{18}$ $\alpha$-olefins, isoprene, chloroprene, 1,3-butadiene, diethyl fumarate, allyl acetate, methyl vinyl ketone, and styrene.

The functional group capable of bonding to the gate dielectric includes groups known to form chemical bonds to the selected gate dielectric. Particular selections for X groups include —$PO_3R_2$ or —$OPO_3R_2$ wherein each R is, independently, hydrogen or a $C_1$-$C_{12}$ aliphatic group or a $C_6$-$C_{18}$ aryl or arylalkyl group; —$SO_3H$; alkoxysilyl; chlorosilyl; acetoxysilyl; benzotriazolyl (—$C_6H_4N_3$); —CONHOH; —COOH; —OH; —SH; —COSH; —COSeH; —$C_5H_4N$; —SeH; —NC; amino; and phosphinyl. Benzotriazolyls include, for example, benzotriazolylcarbonyloxy (—OC(=O)$C_6H_4N_3$), benzotriazolyloxy (—O—$C_6H_4N_3$), and benzotriazolylamino (—NH—$C_6H_4N_3$) groups. Specific preferred groups include —$PO_3H_2$, —$OPO_3H_2$, and trimethoxysilyl.

Combinations of at least two $R^1$, $R^2$, and/or X groups may together form a cyclic or polycyclic group that can be aliphatic or aromatic. Specific examples are copolymers incorporating comonomers such as norbornene and substituted norbornenes, maleic anhydride, acenaphthylene, and itaconic anhydride. Also useful are polymers and copolymers which can form crosslinked networks by vinyl-type polymerizations, including those derived from divinylbenzenes, and (meth)acrylate-derived cinnamates.

Thus, the polymeric layer having interpolymerized units of Formula I and, optionally, Formula II, includes a broad array of materials. Specific examples include homopolymers such as polystyrene, poly(1-hexene), poly(methyl methacrylate), poly(acenaphthylene), poly(vinylnaphthalene), poly (butadiene), poly(vinyl acetate), and those derived from $\alpha$-methylstyrene, 4-tert-butylstyrene, 2-methylstyrene, 3-methylstyrene, and 4-methylstyrene. In such homopolymer examples, the polymeric layer comprises 0% of said interpolymerized units according to Formula II.

A preferred polymeric layer is comprised of a polymer having styrenic interpolymerized units. Styrenic interpolymerized units include those derived from styrene and substituted styrenes, such as $\alpha$-methylstyrene, 4-tert-butylstyrene, 2-methylstyrene, 3-methylstyrene, 4-methylstyrene, 4-(phosphonomethyl)styrene, and divinyl benzene.

Copolymers, such as block, random, and alternating, are also useful in the polymeric layer described in this invention. Useful copolymers comprise interpolymerized units of Formula I and optionally Formula II. Preferred examples include copolymers of at least two different monomers selected from styrene, $\alpha$-methylstyrene, 4-tert-butylstyrene, 2-methylstyrene, 3-methylstyrene, and 4-methylstyrene.

Other preferred examples include those materials having units of Formula II. Specific examples of monomers useful to form Formula II units include vinylphosphonic acid and other phosphonic acid-containing comonomers such as 4-(phosphonomethyl)styrene, and trialkoxysilane-containing comonomers such as 3-(trimethoxysilyl)propyl methacrylate. Preferred examples include a variety of copolymers of styrene and vinylphosphonic acid, copolymers of styrene and other phosphonic acid-containing comonomers, copolymers of styrene and phosphonate-containing comonomers, copolymers of styrene and phosphate-containing comonomers, a copolymer of styrene and 4-(phosphonomethyl) styrene, a copolymer of styrene and trimethoxysilylpropyl methacrylate, and copolymers of styrene and silyl-containing comonomers.

A class of polymers useful in the present invention includes hydrocarbon olefin homo- and co-polymers of ethylene, propylene, and higher α-olefins. These olefins can be represented by the general structure $CH_2CHR$, wherein R is hydrogen or a $C_1$-$C_{10}$ (preferably $C_1$-$C_6$) aliphatic radical. Copolymers may comprise one or more ethylenically-unsaturated comonomers which are copolymerizable with such olefins. These include vinyl esters, such as vinyl acetate; acrylic and α-alkyl acrylic acids and their alkyl esters, amides, and nitriles, such as methyl methacrylate and acrylonitrile; vinyl aromatics, such as styrene and vinylnaphthalene; anhydrides and alkyl esters of maleic and fumaric acids; vinyl alkyl ethers; vinylpyridine; N-vinylcarbazole; and dienes, such as 1,3-butadiene.

Polymers useful for this invention may also be prepared by the introduction of functional groups. These can be provided through the use of a variety of materials, typically referred to as functional initiators, functional chain transfer agents, or functional chain terminators. Examples of these materials include phosphorus oxychloride, mercaptopropyltrialkoxysilanes, chlorotrialkoxysilanes, and tetrachlorosilane. The introduction of these species typically introduces a functional group at the end or midpoint of a polymer chain. Examples of useful polymeric species prepared using these reactants include α-(triethoxysilyl)propylthio polystyrene, and ω-(phosphonic acid) polystyrene.

The polymer layer may be derived from a ring-opening polymerization. A wide variety of monomers may be used in this embodiment. Examples of suitable monomers include cyclic ethers, cyclic amides, cyclic amines, cyclic sulphides, and inorganic ring compounds such as phosphonitrilic chlorides. The repeat units of the polymer in these materials are joined by links similar to those found in the monomer, but rearranged to provide a linear rather than cyclic chain. These polymerizations may proceed by a variety of mechanisms. One specific type of ring-opening polymerization is a ring-opening metathesis polymerization, or ROMP. Suitable monomers that can be polymerized in this fashion include norbornenes, $C_4$-$C_{10}$ cyclic alkenes, and $C_4$-$C_{10}$ cyclic nonconjugated dienes. These ROMP monomers may be substituted with one or more $C_1$-$C_{20}$ straight-chain or branched aliphatic groups, aromatic groups, or arylalkyl groups, any of which may include one or more heteroatoms. As is known, aliphatic groups may be saturated or may contain one or more carbon-carbon multiple bonds, while arylalkyl groups contain both aliphatic and aromatic structures. Specific materials useful in this aspect of the invention include straight-chain or branched $C_1$-$C_{18}$ alkyl-substituted norbornenes, trialkoxysilyl-substituted norbornenes, esters of 5-norbornene-2-carboxylic acid, esters of 2-phosphono-5-norbornene, 1,4-cyclooctadiene, and dicyclopentadiene.

The polymeric layer may be derived from monomeric precursors, monomers, and oligomers comprising an aromatic-functional segment. Such polymeric materials are found in the class of aromatic thermosets. A preferred class of aromatic thermosets is the polyarylenes, for example, polyphenylene and polynaphthalene. Such polyarylenes include polymers containing heteroatoms, for example, polyarylene ethers. Polyarylenes can be prepared in a variety of ways. One useful means of preparing polyarylene compositions is by applying suitable monomeric or oligomeric precursors to the dielectric layer and subsequently polymerizing these materials through exposure to an energy source, such as by heating or irradiation. A preferred class of oligomer is a low molecular weight aromatic thermosetting composition comprised of cyclopentadienone and acetylene-substituted materials. The molecular weight is sufficiently low to permit spin coating of these oligomers. Such materials are commerically available as SiLK™ resin from Dow Chemical Co., Midland, Mich. The SiLK™ resin is more fully described in "Development of a Low-Dielectric-Constant Polymer for the Fabrication of Integrated Circuit Interconnect", Martin, J. P., et al., Adv. Mater. 2000, 12(23), 1769-1778 and references therein, and U.S. Pat. Nos. 5,956,679 and 6,288,188, which are all herein incorporated by reference. The SiLK™ resin can be spin-coated onto surfaces and then subsequently cured by heating to form an insoluble polyarylene film.

Other useful oligomeric compositions are polyfunctional o-phenylethynyl-substituted aromatic monomers which crosslink upon exposure to an energy source, especially thermal radiation, to form polynaphthalenes. Other examples of classes of monomeric precursors that form aromatic thermoset polymers include: cinnamates, divinylbenzenes, diacetylenes, benzocyclobutenes, and substituted derivatives thereof.

Other preferred classes of polyarylenes are the parylenes (i.e., poly(p-xylylene) polymers) and the polyfluorenes. The parylenes are semicrystalline polymers prepared by simultaneous adsorption and polymerization of reactive p-xylylene monomers from their vapor onto a surface. The vapor deposition of the monomer and its polymerization results in the formation of a thin film of uniform thickness conformal to the substrate surface that is effectively free of pinholes. Useful parylenes include parylene N, parylene C, and parylene D.

In another aspect, useful polymers and copolymers of this invention are substantially non-polar, glassy solids at room temperature. Preferably, the polymer comprises 80 mole % or more of alkyl, aryl, or arylalkyl monomer units, wherein said monomer units are substantially free of heteroatoms. The polymer has fewer than about 20 mole % of monomer units containing heteroatoms (more preferably, fewer than about 10 mole %). Furthermore, said polymer preferably has a glass transition temperature ($T_g$) measured in the bulk of at least about 25° C., more preferably of at least about 50° C., and most preferably at least about 100° C. Examples of these types of polymers include many of those described above, including linear and thermoset materials. Specific examples include polystyrene, polyfluorene, polynorbornene, poly(acenapthylene), and alkyl-substituted derivatives thereof, and functionalized copolymers.

In addition, blends of two or more polymeric or copolymeric materials may be used.

In another aspect, the OTFT of the invention has a substantially nonfluorinated polymeric layer having a thickness less than about 400 Å and the OTFT has a charge carrier mobility at least 50% greater than the charge carrier mobility of a similar OTFT lacking the polymeric layer. In another aspect of the invention, the OTFT has a charge carrier mobility at least 0.02 cm$^2$/Vs, preferably at least 0.10 cm$^2$/Vs, more preferably at least 1.0 cm$^2$/Vs, greater than the charge carrier mobility of a similar OTFT lacking the polymeric layer. In this document, all charge carrier mobility values are room temperature values.

The polymers and copolymers useful in the invention can be prepared by any known means, for example, by free-radical, ring-opening, anionic, cationic, or coordination polymerization of monomers such as those described above. The polymer may also be modified by subsequent reactions to introduce functional groups.

The polymeric layer is provided on the gate dielectric by any known method. For example, the polymeric layer can be provided through a coating process such as spray, spin, dip, knife, gravure, microcontact printing, ink jet printing, stamping, transfer printing, and vapor deposition. The polymeric layer can be provided on the gate dielectric via a solvent-based or solventless method. Presently preferred routes to the polymeric layer include solvent-based methods. When a solution of a polymeric layer precursor is provided on the gate dielectric layer, the solvent is removed by a method compatible with the materials involved, for example by heating.

In one embodiment, the source and drain electrodes are deposited adjacent to the gate dielectric before providing the polymeric layer. Then, the polymeric layer is applied. After the layer comprising a polymer is complete, the organic semiconductor layer is deposited over the source and drain electrodes and over the polymeric layer adjacent to the gate dielectric. Before deposition of the semiconductor, the material deposited on the gate dielectric to provide the polymeric layer may be rinsed so the source and drain electrodes are essentially free of the polymeric layer. That is, less than about 5 Å of polymeric layer, more preferably less than 1 Å and most preferably no polymeric layer, is present on the source and drain electrodes.

OTFT Methods

The present invention also provides a method of making a thin film transistor comprising the steps of: (a) providing a substrate; (b) depositing a gate electrode material on the substrate; (c) providing a gate dielectric on the gate electrode material; (d) applying a substantially nonfluorinated polymeric layer adjacent to the gate dielectric, the polymeric layer having a thickness less than about 400 Å; (e) providing an organic semiconductor layer adjacent to the polymeric layer; and (f) depositing a source electrode and a drain electrode contiguous to the organic semiconductor layer. The polymeric layer is selected from those described above, including combinations of two or more such polymeric layer materials. These steps can be performed in the order listed or in another order so long as the polymeric layer is interposed between the gate dielectric and the organic semiconductor layer. For example, the organic semiconductor layer can be provided over or under the source and drain electrodes.

Additional steps are useful in certain embodiments of the present invention. For example, rinsing may be performed after applying the polymeric layer. The polymeric layer may be applied via deposition of a polymer solution or a monomer solution which is then polymerized. The applied material may be exposed to an energy source, such as thermal radiation, UV or visible light, to remove solvent and/or crosslink the material to form the polymeric layer on the gate dielectric surface. Any combination of rinsing and/or energy-exposure may be used for particular embodiments, such as rinsing before or after heating, rinsing only, or heating without rinsing.

The present invention also provides an integrated circuit comprising a plurality of OTFTs made by the process described above and a method of making an integrated circuit comprising providing a plurality of OTFTs of the invention. Thus, the present invention is embodied in an article that comprises one or more of the OTFTs described. Such articles include, for example, radio-frequency identification tags, backplanes for active matrix displays, smart cards, memory devices, and the like. In devices containing the OTFTs of the present invention, such OTFTs are operatively connected by means known in the art.

The entire process of making the thin film transistor or integrated circuit of the present invention can be carried out below a maximum substrate temperature of about 450° C., preferably below about 250° C., more preferably below about 150° C. In another aspect, temperatures below about 70° C., such as temperatures around room temperature (about 25° C.) can be used. The temperature selection generally depends on the substrate and processing parameters known in the art, once one is armed with the knowledge of the present invention contained herein. These temperatures are well below traditional integrated circuit and semiconductor processing temperatures, which enables the use of any of a variety of relatively inexpensive substrates, such as flexible polymeric substrates. Thus, the invention enables production of relatively inexpensive integrated circuits containing organic thin film transistors with significantly improved performance.

The OTFT of the present invention has one or more advantages over known organic thin film transistors. These advantages are apparent, for example, in charge-carrier mobility. The present invention provides OTFTs having a charge-carrier mobility greater than a comparison OTFT lacking the polymeric layer of the present invention. The OTFTs of the invention preferably have a charge-carrier mobility at least about 25% greater, more preferably at least about 50% greater, even more preferably at least about 75% greater, and in some embodiments at least about 100% greater, than the charge-carrier mobility of a comparison OTFT not made according to the present invention. Such improvements in charge-carrier mobility are provided while maintaining OTFT properties within desirable ranges. For example, the above-described improvements are obtained while providing a threshold voltage between about 25 and −25 V, a subthreshold slope below about 10 V/decade (absolute value), an on/off ratio of at least about $10^4$, and a charge-carrier mobility at least about $10^{-2}$ cm$^2$/Vs when the semiconductor layer comprises a p-type semiconductor or at least about $10^{-4}$ cm$^2$/Vs when the semiconductor layer comprises an n-type semiconductor. Various embodiments of the invention provide OTFTs with two, three, or more of these properties.

The invention provides a p-type semiconductor OTFT having a threshold voltage of between about −25 and 25 V, preferably a threshold voltage of between about 0 and −10 V, more preferably between about 0 and −5 V. The invention provides an n-type semiconductor OTFT having a threshold voltage of between about −25 and 25 V, preferably a threshold voltage of between about 10 and 0 V, more preferably between about 5 and 0 V. The invention provides an OTFT with a subthreshold slope below about 10 V/decade (absolute value), preferably a subthreshold slope below about 5 V/decade (absolute value), more preferably below about 2 V/decade (absolute value). The invention provides an OTFT with an on/off ratio of at least about $10^4$, preferably at least about $10^5$, more preferably at least about $5 \times 10^5$, and even more preferably at least about $10^6$.

More specifically, in an embodiment having pentacene or a substituted pentacene as the organic semiconductor, the invention provides an OTFT with a charge-carrier mobility at least about 0.1 cm$^2$/Vs, more preferably at least 0.2 cm$^2$/Vs, and even more preferably at least about 0.5 cm$^2$/Vs. In some embodiments of the present invention, the charge-carrier mobility is above 1.0, or even above 2.0 cm$^2$/Vs. Particular embodiments of the present invention have shown a charge-carrier mobility greater than that reported for bulk single crystals of pentacene. In another embodiment of the invention, a pentacene OTFT has a charge-carrier mobility of at least about 2 cm$^2$/Vs, a negative threshold voltage, a subthreshold slope below about 3 V/decade, and an on/off ratio at least about $5 \times 10^5$.

In another embodiment of the invention, a tetracene OTFT has shown a charge-carrier mobility above 0.05 cm$^2$/Vs.

Objects and advantages of this invention are further illustrated by the following examples, but the particular materials and amounts thereof recited in these examples, as well as other conditions and details, should not be construed to unduly limit this invention.

EXAMPLES

Test Methods

A. Film Thickness

Single wavelength ellipsometry was employed to obtain estimates of polymeric layer thickness. Substrate values of Psi and Delta ($\psi_s$ and $\Delta_s$) were obtained from the cleaned substrates (described below) at an angle of incidence of 70° and a wavelength of 632.8 nm using a Gaertner Dual Mode Automatic Ellipsometer, model L116A (Gaertner Co., Skokie, Ill.). The polymeric layer was applied to the substrates, and values were measured ($\psi_f$ and $\Delta_f$).

Ellipsometry modeling software, WVASE32 (from J. A. Woollam, Inc., Lincoln, Nebr.) was used to construct optical models appropriate to the specific polymer and substrate investigated. Material optical constants included with the program were used unless specified otherwise.

For thermal oxide on silicon substrates, the optical model consisted of 1000 Å of SiO$_2$ on 50 Å of an intermix layer (a Bruggeman effective medium approximation consisting of 50% SiO$_2$ and 50% Si) on top of a silicon substrate. The floating variables in the fit were the SiO$_2$ thickness, the intermix layer thickness and the intermix layer SiO$_2$ percentage (where the Si percentage is adjusted to make up the balance of the interlayer composition). Typical fit values were 950-990 Å SiO$_2$, 40-60 Å intermix consisting of 20-60% SiO$_2$.

For alumina layers on silicon substrates, the optical model was 1500 Å of Al$_2$O$_3$ on Si. The floating variables in the fit were the thickness in Angstroms (d) and refractive index (n) of the Al$_2$O$_3$. Seed values of d=1500 and n=1.77 were used. Typical final fit values were between 1400 Å and 1700 Å with n between 1.56 and 1.60.

For silicon nitride layers, an optical model of 1500 Å Si$_3$N$_4$ on Si was used, in which both the thickness and refractive index of the Si$_3$N$_4$ were allowed to vary. A seed value of 2.02 was used for the refractive index of Si$_3$N$_4$. Typical final fit values were 1450 to 1480 Å for the thickness and 2.04 to 2.05 for the refractive index of the Si$_3$N$_4$.

Once the substrate parameters were determined by modeling $\psi_s$ and $\Delta_s$, they were fixed and a polymer layer was added to the optical model, between the air and dielectric layers. This layer had a variable thickness, but its refractive index was fixed at a value typical of that polymer in its bulk state. The refractive index of copolymer samples was estimated. The polymeric layer thickness was then varied to achieve the best fit to $\psi_f$ and $\Delta_f$. Each thickness reported in Table 1 (below) was the average of four measurements on each sample.

B. Water Contact Angle (WCA)

Static, advancing, and receding water contact angles were measured with a video contact angle apparatus (Model VCA-2500XE, from AST Products, Billerica, Mass.). Values reported were averages of measurements on both sides of at least three drops on each tested surface. Estimated uncertainties in these measurements were +/−1 degree in static and advancing measurements and +/−2 degrees in receding measurements. Surface characterization data are summarized in Table 1 (below).

C. Thin Film Transistor Performance

Transistor performance was tested at room temperature in air using techniques known in the art, for example as shown in S. M. Sze, *Physics of Semiconductor Devices*, page 442, John Wiley & Sons, New York, 1981, which is herein incorporated by reference. A Semiconductor Parameter Analyzer (model 4145A from Hewlett-Packard, Palo Alto, Calif.) was used to obtain the results below.

For p-type semiconductors, the square root of the drain current ($I_d$) was plotted as a function of gate-source bias ($V_g$), from +10V to −40V for a constant source-drain bias ($V_d$) of −40V. For n-type semiconductors, the square root of the drain current ($I_d$) was plotted as a function of gate-source bias ($V_g$), from −10V to +40V for a constant source-drain bias ($V_d$) of +40V. The saturation field effect mobility was calculated from the straight line portion of the curve using the specific capacitance of the gate dielectric, the channel width and the channel length. The x-axis extrapolation of this straight-line fit was taken as the threshold voltage ($V_t$). In addition, plotting $I_d$ as a function of $V_g$ yielded a curve where a straight line fit was drawn along a portion of the curve containing $V_t$. The inverse of the slope of this line was the subthreshold slope (S). The on-off ratio was taken as the difference between the minimum and maximum drain current ($I_d$) values of the $I_d$-$V_g$ curve.

Substrates

Single crystal <100> orientation heavily-doped silicon wafers were obtained from Silicon Valley Microelectronics, San Jose, Calif. A 1500 Å layer of alumina (Wafer A), or a 1000 Å layer of high temperature thermal silicon oxide (Wafer B) was deposited on each wafer front via chemical vapor deposition methods. Alternatively, a 1500 Å layer of silicon nitride (Wafer C) was deposited on each wafer front via physical vapor deposition methods. A 5000 Å layer of aluminum metal was vapor deposited onto the backside of each wafer. In this demonstration, the doped wafer capped with aluminum served as the gate electrode and the aluminum oxide, silicon oxide, or silicon nitride functioned as the gate dielectric when organic thin film transistors were prepared.

Wafer Preparation and Polymer Coating

Wafer substrates were quartered and cleaned by 5 min exposure in a UV/ozone chamber. The material of choice was applied by spin coating (300 rpm/5 s then 2000 rpm/15 s) a solution of the polymer in toluene as named in the particular example and allowed to dry in air and without rinsing, unless otherwise noted. Ellipsometric film thickness and water contact angles were measured using the procedures outlined above. Results appear in the tables below.

Semiconductor Coating

Pentacene (available from Aldrich Chemical) was purified in a 3-zone furnace (Thermolyne 79500 tube furnace, from Barnstead Thermolyne, Dubuque, Iowa) at reduced pressure under a constant flow of nitrogen gas.

The purified pentacene was deposited by sublimation under vacuum (approximately $10^{-6}$ Torr (or $1.33 \times 10^{-4}$ Pa)) onto the polymeric surface at a rate of 0.5 Å per second to reach a thickness of 500 Å as measured by a quartz crystal microbalance.

Final Steps for Device Preparation and Testing

Palladium or gold source and drain electrodes were shadow masked onto the p-type semiconductor layer, while aluminum source and drain electrodes were shadow masked onto the n-type semiconductor layer. The device dimensions were 40 μm to 60 μm channel length×1000 μm channel width.

Multiple OTFTs were prepared and a representative sample of at least six pentacene OTFTs was tested for each of at least two deposition runs. For the other semiconductors, between three and twelve OTFTs were tested. Averaged results appear below in Table 2.

Examples 1-3

Samples of Wafers A, B, and C were quartered and cleaned using the procedure described above. A solution of 0.1 wt % polystyrene (secondary standard with a weight average molecular weight of 239,700 and a number average molecular weight of 119,628, available from Aldrich Chemicals, Milwaukee Wis.) in toluene was applied to each wafer using the Polymer Coating Procedure described above, except that the spin coating conditions were 500 rpm for 20 seconds then 2000 rpm for 40 seconds, followed by 5 minutes dry time in air and 5 minutes in an oven set at 110° C. Pentacene was applied as described above. OTFTs were prepared and tested as described above. Results are shown in Tables 1 and 2 below.

Example 4

Wafers were quartered and cleaned using the procedure described above. A solution of 0.1 wt % poly(methyl methacrylate) (available from Aldrich, having a weight average molecular weight of approximately 70,000 g/mol as determined by GPC using polystyrene standards) in toluene was applied to Wafer B samples using the Polymer Coating Procedure described above. Pentacene was applied as described above. OTFTs were prepared and tested as described above. Results are shown in Tables 1 and 2 below.

Example 5-6

Wafers were quartered and cleaned using the procedure described above. A solution of 0.1 wt % poly(acenaphthylene) (Aldrich) in toluene was applied to Wafer A samples (Example 5) and Wafer B samples (Example 6) using the Polymer Coating Procedure described above. Pentacene was applied as described above. OTFTs were prepared and tested as described above. Results are shown in Tables 1 and 2 below.

Examples 7-8

Poly(styrene-co-vinylphosphonic acid) was synthesized by free radical polymerization in solution. The starting materials were commercially available, e.g., from Aldrich Chemicals, Milwaukee, Wis. To a solution of styrene (4.04 g, 39 mmol) in ethyl acetate (16 g) were added vinylphosphonic acid (0.45 g, 4.2 mmol) and benzoyl peroxide (0.0295 g, 0.12 mmol). The resulting solution was sparged with nitrogen for 15 minutes, sealed, and heated at 85° C. for 16 h. After cooling to room temperature, the solution was precipitated into 200 mL of heptane. The precipitate was separated by filtration and dried under vacuum at 40° C. overnight to obtain the polymer. This material was approximately 92.3 mole % styrene and 7.7 mole % vinylphosphonic acid, as obtained from $^1H/^{31}P$ NMR cross-integration, and had a weight-average molecular weight of 17.5 kg/mol from gel permeation chromatography in tetrahydrofuran against polystyrene standards.

A 0.1 wt % solution of the polymer in toluene was applied to Wafer A samples (Example 7) and Wafer B samples (Example 8) using the described Polymer Coating Procedure. The spin-coated sample was then baked on a hot plate in air at 150° C. for 3 minutes and rinsed with fresh toluene. Pentacene was applied as described above. OTFTs were prepared and tested as described above. Results are shown in Tables 1 and 2 below.

Example 9

A phosphonic acid end-functional polystyrene was synthesized by anionic polymerization in solution. The starting materials were obtained from Aldrich Chemicals. The styrene and cyclohexane were purified by passage through basic alumina, followed by sparging with dry nitrogen for 30 minutes. The sec-butyllithium and POCl$_3$ were used as received. A 3-neck reactor was evacuated and dried, then filled with dry nitrogen. To this reactor was added 100 mL of cyclohexane by cannula, followed by 0.5 mL (4 mmol) of styrene by syringe. To the reactor was then added 0.7 mL of sec-butyllithium (1.3 mol/L in cyclohexane), followed by 9.5 mL (83 mmol) of styrene. The polymerization was allowed to proceed for 4 h at room temperature, at which point 3 mL (32 mmol) of phosphorus oxychloride was added. The reaction mixture was stirred for 12 h, after which 10 mL of deionized water was added, and stirring was continued for an additional 4 h. The resulting polymer was precipitated into methanol, yielding a material with a weight average molecular weight of 131 kg/mol by gel permeation chromatography (GPC) against polystyrene standards. A 0.1 wt % solution of the polymer in toluene was applied to Wafer A samples using the described Polymer Coating Procedure. The sample was baked on a hot plate at 150° C. for 3 minutes and then rinsed in fresh toluene. Pentacene was applied as described above. OTFTs were prepared and tested as described above. Results are shown in Tables 1 and 2 below.

Example 10

A trimethoxysilyl end-functional polystyrene was synthesized by free radical polymerization in solution. The starting materials were commercially available from Aldrich Chemicals, with the exception of VAZO 67, an azo compound which was commercially available from Dupont Chemical, Wilmington, Del. To a solution of styrene (15.0 g, 144 mmol) in 35 g of ethyl acetate was added 0.0300 g (0.16 mmol) of VAZO 67 and 0.08 g (0.41 mmol) of (3-mercaptopropyl)trimethoxysilane. The resulting solution was sparged with nitrogen for 20 minutes, and heated with agitation for 16 hours at 60° C. The resulting polymers were precipitated into 250 mL of methanol, recovered by filtration, and dried in a vacuum oven at 40° C. for 12 hours. The resulting polymer had a weight average molecular weight of 195 kg/mol by GPC against polystyrene standards. A 0.1 wt % solution of the polymer in toluene was applied to Wafer B samples using the Polymer Coating Procedure described above. The samples were baked on a hot plate at 150° C. for 3 minutes and then rinsed with fresh toluene. Pentacene was applied as described above. OTFTs were prepared and tested as described above. Results are shown in Tables 1 and 2 below.

Example 11

A trimethoxysilyl-functional polystyrene was synthesized by free radical polymerization in solution. The starting materials were obtained from Aldrich Chemicals, with the exception of (methacryloxypropyl)trimethoxysilane (MAPTMS), which was commercially available from Gelest, Inc., Tullytown Pa. To a solution of styrene (7.2 g, 69 mmol) in 35 mL of ethyl acetate was added MAPTMS (0.79 g, 3.2 mmol) and benzoyl peroxide (0.0608 g, 0.25 mmol). The resulting solution was sparged with nitrogen for 15 minutes, sealed, and heated at 85° C. for 10 h. After cooling to room temperature, the polymer was precipitated in 200 mL of heptane, collected, and dried overnight under vacuum at 40° C. The resulting polymer was 94 mole % styrene and 6 mole % MAPTMS based on $^1$H NMR, and had a weight-average molecular weight of 791 kg/mol from gel permeation chromatography against polystyrene standards. A 0.1 wt % solution of the polymer in toluene was applied to Wafer B samples using the described Polymer Coating Procedure. The samples were baked on a hot plate at 150° C. for 3 minutes and then rinsed in fresh toluene. Pentacene was applied as described above. OTFTs were prepared and tested as described above. Results are shown in Tables 1 and 2 below.

Example 12

Poly(5-hexylnorbornene-co-5-(triethoxysilyl)norbornene) was synthesized as follows. All materials were obtained from Aldrich, except tris(perfluorophenyl)boron (from Strem Chemicals, Newburyport, Mass.), 5-(triethoxysilyl)norbornene (from Gelest Inc., Tullytown, Pa.), and 5-hexylnorbornene, which was synthesized as described in U.S. Pat. No. 3,557,072. Toluene and 1,2-dichloroethane were purified by passage over a 30 cm column filled with activated 4 Å molecular sieves and neutral alumina. 5-(Triethoxysilyl)norbornene was vacuum distilled from CaH$_2$. 5-Hexylnorbornene was vacuum distilled and passed over a 30 cm column filled with activated 4 Å molecular sieves and neutral alumina.

To a clean, dry 100 mL serum vial with cap under an inert atmosphere was added 8.52 g (47.79 mmol) 5-hexylnorbornene, 30 ml toluene (dried and degassed), 1.36 g (5.31 mmol) of 5-(triethoxysilyl)norbornene, 0.26 ml (26 µmol) of a 0.10 M solution of Ni(II)-bis(2,2,6,6-tetramethyl-3,5-heptanedionate) in toluene, 0.26 ml (260 µmol) of triethylaluminum (1.0 M in hexanes), and 2.34 ml (234 µmol) of a 0.1 M solution in 1,2-dichloroethane of tris(perfluorophenyl) boron. Upon addition of the triethylaluminum, the solution went from a light purple color to brown. The solution was stirred in the drybox overnight, whereupon it was removed. To the contents of the vial were added 0.50 g 8-hydroxyquinoline dissolved in 150 mL cyclohexane. After stirring a further 24 hours, the solution was filtered through a fine glass frit (15-20 µm) followed directly by filtration through a 0.1 µm filter. The polymer was then precipitated in 900 mL of rapidly stirred acetone. Filtration on a fine glass frit, followed by washing with two 100 mL portions of fresh acetone afforded the polymer as a white solid. The resulting polymer was then dried under vacuum overnight.

Wafer B samples were quartered and cleaned using the procedure described above. A 0.1 wt % solution of silylated norbornene in toluene was applied to the wafer samples. The solution was applied via the Polymer Coating Procedure described above, then the samples were baked on a hotplate at 150° C. for 3 min., then rinsed with fresh toluene. Pentacene was applied as described above. OTFTs were prepared and tested as described above. Results are shown in Tables 1 and 2 below.

Comparative Examples 1-3 (CE1, CE2, and CE3)

Wafers were quartered and cleaned immediately before use using consecutive rinses in acetone, methanol, 2-propanol and water, baked on a hot plate at 100° C. for 3 minutes and exposed to UV/ozone in a home built chamber for 15 minutes. Wafer A was used for CE1, Wafer B was used for CE2, and Wafer C was used for CE3. Pentacene was applied as described above. OTFTs were prepared and tested as described above. Results are shown in Tables 1 and 2 below.

Example 13

Wafer B samples were quartered and cleaned using the procedure described above. A 0.1 wt % solution of polystyrene in toluene was applied to the samples as in Example 2.

Copper(II) hexadecafluorophthalocyanine was used as received (copper(II) 1,2,3,4,8,9,10,11,15,16,17,18,22,23,24,25-hexadecafluoro-29H,31H-phthalocyanine from Aldrich). The unpurified semiconductor was vapor-deposited by the pentacene method described above.

OTFTs were prepared and tested as described above. Results are shown in Tables 1 and 2 below.

Comparative Example 4 (CE4)

OTFT samples were prepared and tested as in Comparative Example 2 except that copper(II) hexadecafluorophthalocyanine was used rather than pentacene. Results are shown in Tables 1 and 2 below.

Example 14

Wafer B samples were quartered and cleaned using the procedure described above. A 0.1 wt % solution of polystyrene in toluene was applied as in Example 2.

Tetracene, available as 2,3-benzanthracene from Aldrich, was purified in the furnace described above under reduced pressure and flowing forming gas (Ar with 2-6% H$_2$) at a temperature about 230° C. The purified tetracene was vapor-deposited by the pentacene method described above.

OTFTs were prepared and tested as described above. Results are shown in Tables 1 and 2 below.

Comparative Example 5 (CE5)

OTFT samples were prepared and tested as in Comparative Example 2 except that purified tetracene was used rather than pentacene. Results are shown in Tables 1 and 2 below.

Examples 15-17

Wafers were quartered and cleaned using the procedure described above. A 0.1 wt % solution of polystyrene in toluene was applied as in Examples 1-3 to samples of Wafer A (Example 15), Wafer B (Example 16), and Wafer C (Example 17), respectively.

Sexithiophene (obtained from Syncom, BV, The Netherlands) was purified in the Barnstead/Thermolyne furnace under reduced pressure and flowing nitrogen at a temperature of ~260° C. The purified sexithiophene was vapor-deposited by the pentacene method described above. OTFTs were prepared and tested as described above. Results are shown in Tables 1 and 2 below.

Comparative Examples 6-8 (CE6, CE7, and CE8)

Wafers were prepared as in Comparative Examples 1-3 except with purified sexithiophene rather than pentacene. Wafer A was used for CE6, Wafer B was used for CE7, and Wafer C was used for CE8. OTFTs were prepared and tested as described above. Results are shown in Tables 1 and 2 below.

TABLE 1

Thickness and Water Contact Angles (WCA)

| Ex. | Thickness (Å) | Advancing WCA | Static WCA | Receding WCA |
|---|---|---|---|---|
| 1 | 91 | 106 | 101 | 82 |
| 2 | 103 | 110 | 101 | 80 |
| 3 | 90 | 101 | 96 | 77 |
| 4 | 55 | 74 | 67 | 55 |
| 5 | 34 | 89 | 87 | 74 |
| 6 | 38 | 94 | 85 | 75 |
| 7 | 49 | 91 | 89 | 78 |
| 8 | 41 | 90 | 87 | 81 |
| 9 | 23 | 92 | 89 | 76 |
| 10 | 44 | 91 | 91 | 78 |
| 11 | 31 | 89 | 89 | 79 |
| 12 | 43 | 107 | 103 | 88 |
| 13 | 103 | 110 | 101 | 80 |
| 14 | 103 | 110 | 101 | 80 |
| 15 | 91 | 106 | 101 | 82 |
| 16 | 103 | 110 | 101 | 80 |
| 17 | 90 | 101 | 96 | 77 |

The thickness measurement was not applicable to the Comparative Examples, which all had advancing, static, and receding water contact angles of less than 20 degrees.

TABLE 2

OTFT Performance

| Ex. | Mobility (cm$^2$/Vs) | Threshold Voltage (V) | Sub-threshold Slope (V/decade) | On/Off Ratio |
|---|---|---|---|---|
| 1 | 2.9 | 1.2 | 1.9 | 8 × 10$^5$ |
| 2 | 4.8 | −0.14 | 2.1 | 1.1 × 10$^6$ |
| 3 | 4.4 | 2.4 | 1.8 | 8.6 × 10$^5$ |
| 4 | 0.30 | −7.9 | 3.1 | 8.6 × 10$^5$ |
| 5 | 0.70 | −15.8 | 1.0 | 1.9 × 10$^7$ |
| 6 | 0.59 | −6.4 | 1.3 | 3.6 × 10$^6$ |
| 7 | 2.4 | −2.8 | 3.1 | 6 × 10$^5$ |
| 8 | 1.9 | −8.2 | 4.3 | 4.4 × 10$^5$ |
| 9 | 1.4 | 2.8 | 1.6 | 6.9 × 10$^5$ |
| 10 | 1.1 | −0.8 | 1.6 | 1.1 × 10$^6$ |
| 11 | 0.83 | −2.6 | 1.8 | 1.5 × 10$^6$ |
| 12 | 3.2 | −1.1 | 1.8 | 2.6 × 10$^6$ |
| CE1 | 0.98 | −6.7 | 1.7 | 1.9 × 10$^7$ |
| CE2 | 0.30 | −8.5 | 4.1 | 1.7 × 10$^5$ |
| CE3 | 0.36 | −4.5 | 4.9 | 1.7 × 10$^4$ |
| 13 | 0.00088 | 8.6 | 3.3 | 7.5 × 10$^3$ |
| CE4 | 0.00016 | 10.7 | 4.4 | 1.5 × 10$^3$ |
| 14 | 0.055 | −10.0 | 1.6 | 5.3 × 10$^6$ |
| CE5 | N/A | N/A | N/A | N/A |
| 15 | 0.15 | −4.6 | 1.8 | 3.5 × 10$^5$ |
| 16 | 0.10 | −4.6 | 1.2 | 1.2 × 10$^5$ |
| 17 | 0.17 | −3.8 | 1.3 | 4.5 × 10$^5$ |
| CE6 | 0.07 | 4.4 | 7.7 | 1.7 × 10$^2$ |
| CE7 | 0.05 | −1.8 | 3.9 | 1.5 × 10$^4$ |
| CE8 | 0.03 | 11.5 | 12.6 | 1.0 × 10$^2$ |

In CE5, no transistor behavior was observed. In CE6, only one OTFT was tested.

Various modifications and alterations of this invention will be apparent to those skilled in the art in view of the foregoing description, without departing from the scope and principles of this invention. Accordingly, it should be understood that this invention is not to be unduly limited to the illustrative embodiments set forth hereinabove.

We claim:

1. An organic thin film transistor (OTFT) comprising a substantially nonfluorinated polymeric layer having a thickness less than about 400 Å interposed between a gate dielectric and an organic semiconductor layer, wherein said polymeric layer comprises polyarylene derived from monomeric precursors, monomers, and oligomers comprising an aromatic-functional segment.

2. The transistor of claim 1 wherein the polymeric layer has a thickness less than about 200 Å.

3. The transistor of claim 1 wherein the polymeric layer has a thickness from about 5 Å to about 200 Å.

4. The transistor of claim 1 wherein said monomers are selected from divinyl benzene, straight-chain or branched $C_1$-$C_{18}$ aliphatic or arylalkyl cinnamates, and benzocyclobutene.

5. The transistor of claim 1 wherein said polyarylene comprises polyfluorene.

6. The transistor of claim 1 wherein said polyarylene is a parylene polymer.

7. The transistor of claim 1 wherein said polymeric layer comprises a substantially non-polar polymer having a $T_g$ above about 25° C.

8. The transistor of claim 1 wherein said polymeric layer comprises a polyarylene derived from heating a composition comprised of cyclopentadienone and acetylene-substituted materials.

9. The organic thin film transistor of claim 1 having at least one property selected from:
   a) a threshold voltage between about −25 and 25 volts;
   b) a subthreshold slope below about 10 volts per decade (absolute value);
   c) an on/off ratio of at least about 10$^4$;

d) a charge-carrier mobility at least about $10^{-2}$ cm$^2$/Vs when the semiconductor layer comprises a p-type semiconductor;
e) a charge-carrier mobility at least about $10^{-4}$ cm$^2$/Vs when the semiconductor layer comprises an n-type semiconductor;
f) a charge-carrier mobility at least about 50% greater than a comparison OTFT that lacks the polymeric layer;
g) a charge-carrier mobility at least about 0.02 cm$^2$/Vs greater than a comparison OTFT that lacks the polymeric layer;
h) a charge-carrier mobility at least about 0.10 cm$^2$/Vs greater than a comparison OTFT that lacks the polymeric layer; and
i) a charge-carrier mobility at least about 1.0 cm$^2$/Vs greater than a comparison OTFT that lacks the polymeric layer.

10. The transistor of claim 9 wherein the semiconductor layer comprises pentacene or a substituted pentacene and wherein the transistor has a charge-carrier mobility at least about $10^{-1}$ cm$^2$/Vs.

11. The transistor of claim 1 comprising a gate dielectric that comprises an organic electrically insulating material, optionally capped with an inorganic electrically insulating material.

12. The transistor of claim 1 comprising a gate dielectric that comprises an inorganic electrically insulating material selected from strontiates, tantalates, titanates, zirconates, aluminum oxides, silicon oxides, tantalum oxides, titanium oxides, silicon nitrides, barium titanate, barium strontium titanate, barium zirconate titanate, zinc selenide, zinc sulfide, and alloys, and combinations, and multilayers thereof.

13. The transistor of claim 1 further comprising a non-participating substrate.

14. The transistor of claim 13 wherein the non-participating substrate is selected from inorganic glasses, ceramic foils, polymeric materials, filled polymeric materials, coated metallic foils, acrylics, epoxies, polyamides, polycarbonates, polyimides, polyketones, poly(ether ether ketone), polynorbornenes, polyphenyleneoxides, poly(ethylene naphthalenedicarboxylate), poly(ethylene terephthalate), poly(phenylene sulfide), and fiber-reinforced plastics.

15. The transistor of claim 13 wherein the non-participating substrate is flexible.

16. The transistor of claim 1 wherein the organic semiconductor layer comprises a material selected from acenes, perylenes, fullerenes, phthalocyanines, and oligothiophenes.

17. The transistor of claim 1 wherein the organic semiconductor layer comprises a vapor-deposited organic semiconductor.

* * * * *